United States Patent
Bateman et al.

(10) Patent No.: US 9,293,623 B2
(45) Date of Patent: Mar. 22, 2016

(54) TECHNIQUES FOR MANUFACTURING DEVICES

(71) Applicant: VARIAN SEMICONDUCTOR EQUIPMENT ASSOCIATES, INC., Gloucester, MA (US)

(72) Inventors: Nicholas P. T. Bateman, Reading, MA (US); Deepak A. Ramappa, Somerville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 388 days.

(21) Appl. No.: 13/661,746

(22) Filed: Oct. 26, 2012

(65) Prior Publication Data

US 2014/0120647 A1 May 1, 2014

(51) Int. Cl.
*H01L 21/04* (2006.01)
*H01L 31/068* (2012.01)
*H01L 31/18* (2006.01)

(52) U.S. Cl.
CPC ........ *H01L 31/0682* (2013.01); *H01L 21/0415* (2013.01); *H01L 31/1804* (2013.01); *H01L 31/1864* (2013.01); *Y02E 10/547* (2013.01); *Y02P 70/521* (2015.11)

(58) Field of Classification Search
CPC ... H01L 21/266; H01L 31/18; H01L 21/0415; H01L 21/2253; H01L 29/02; H01L 29/06464; H01L 29/66; H01L 31/1864
USPC ................... 438/514–534, 72, 150, 510–569
See application file for complete search history.

(56) References Cited

U.S. PATENT DOCUMENTS

| 2009/0227095 A1* | 9/2009 | Bateman et al. .............. 438/514 |
| 2010/0184250 A1* | 7/2010 | Blake et al. .................... 438/72 |

\* cited by examiner

*Primary Examiner* — Matthew Landau
*Assistant Examiner* — Eric Ashbahian

(57) ABSTRACT

Techniques for manufacturing a device are disclosed. In accordance with one exemplary embodiment, the technique may be realized as a method for forming a solar cell. The method may comprise: implanting p-type dopants into a substrate via a blanket ion implantation process; implanting n-type dopants into the substrate via the blanket ion implantation process; and performing a first annealing process to form the p-type region and performing a second annealing process to form a second n-type region.

19 Claims, 6 Drawing Sheets

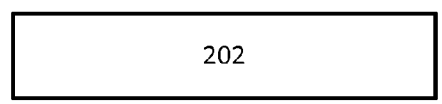
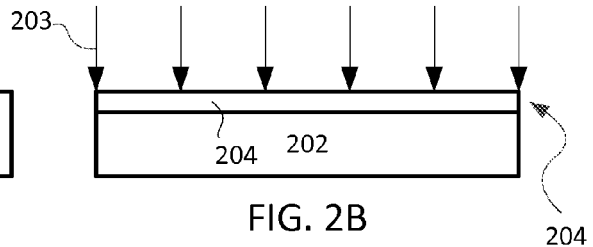
FIG. 2A  FIG. 2B
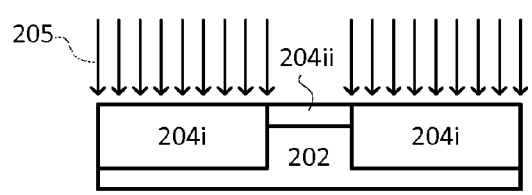
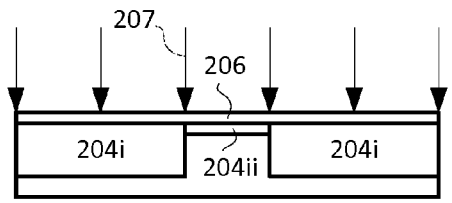
FIG. 2C  FIG. 2D
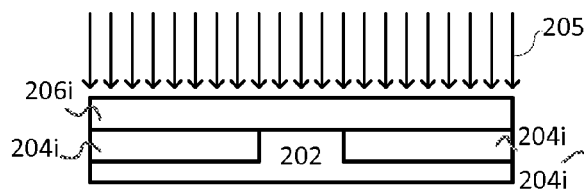
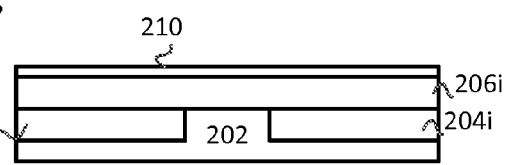
FIG. 2E  FIG. 2F
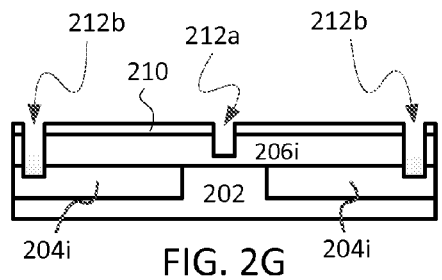
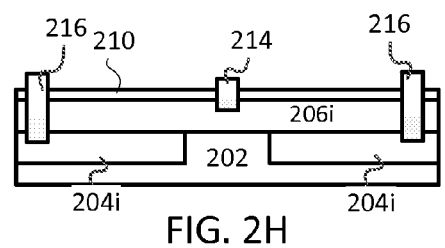
FIG. 2G  FIG. 2H

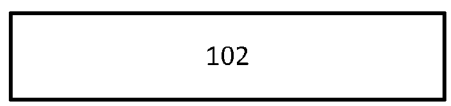
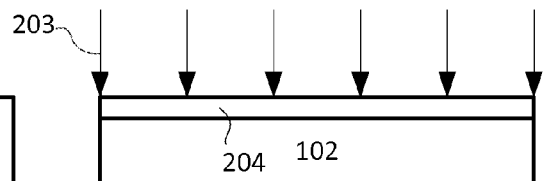
FIG. 5A    FIG. 5B
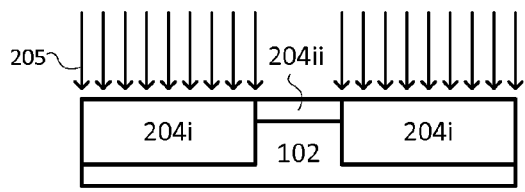
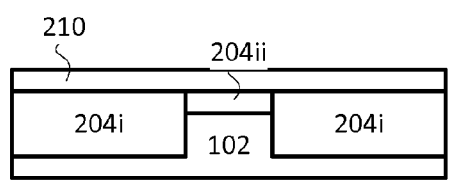
FIG. 5C    FIG. 5D
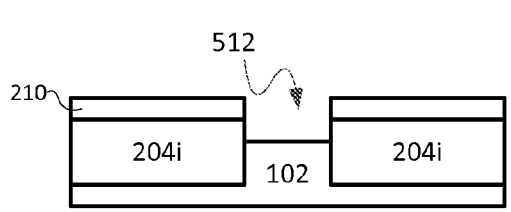
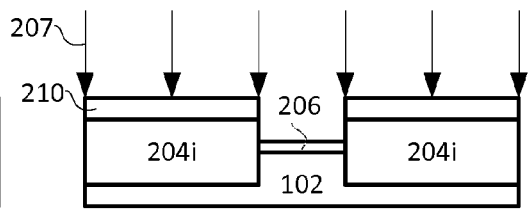
FIG. 5E    FIG. 5F
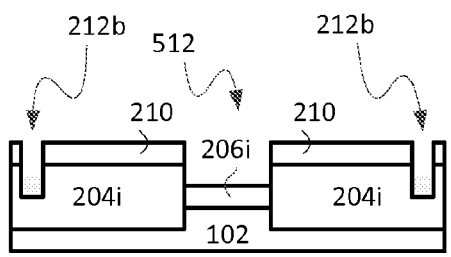
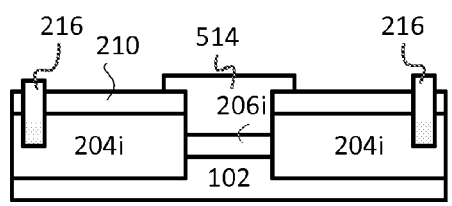
FIG. 5G    FIG. 5H

TECHNIQUES FOR MANUFACTURING DEVICES

FIELDS

The present disclosure relates to techniques for processing substrates, more particularly to techniques for manufacturing devices.

BACKGROUND

An ion implantation process is a process used in a device manufacturing to implant one or more desired species into a target to change at least one of its electrical, optical, chemical, and mechanical property. Depending on the device, the target may be a substrate such as a wafer, or a film or other material formed thereon. In solar cell manufacturing, the target may be silicon or another semiconducting substrate, and ion implantation process is used to alter the optical and/or electrical property of the substrate.

One type of the solar cell that can be manufactured using ion implantation process is an interdigitated back contact (IBC) solar cell. Referring to FIG. 1, there is shown a cross-sectional view of a conventional IBC solar cell 100. The IBC solar cell 100 comprises an n-type base 102. On the front side of the IBC solar cell 100, there may be an n+ front surface field (FSF) 104, a passivating layer 106, and an anti-reflective coating (ARC) 108. Although various dielectric materials may be used as the passivating layer 106, conventional IBC solar cell 100 may include $SiO_2$ as the pasivating layer 106.

On the back side of the IBC solar cell 100, one or more p+emitter 112 and one or more n+ back surface field 114 disposed alternately to form one or more p-n junctions therebetween. Behind the p+ emitter 112 and n+ BSF 114, there may be a passivating layer 122 with a plurality of contact holes 124. A p-type contact finger 126 and an n-type contact finger 128 may be formed behind the passivating layer 122. Each of the p-type contact finger 126 and the n-type contact finger 128 may be contact with the p+ emitter 112 and n+ BSF 114, respectively, via the contact holes.

In operation, the IBC solar cell 100 is positioned such that the front side of the IBC solar cell 100 is exposed to sunlight 132. The sunlight 132 enters the solar cell 100 through the n+ doped region, also known as the front surface field (FSF) 102. Photons in the sunlight with sufficient energy (above the bandgap of the semiconductor) are able to promote an electron within the semiconductor material's valence band to the conduction band creating electron-hole pairs. In order to generate a photocurrent that can drive an external load, these electron-hole pairs need to be separated. This is done through the built-in electric field at the p-n junction. Thus, any electron-hole pairs that are generated in the depletion region of the p-n junction get separated, as are any other minority carriers that diffuse to the depletion region of the device. Since a majority of the incident photons are absorbed in near surface regions of the device, the minority carriers generated in the emitter need to diffuse to the depletion region and get swept across to the other side. As a result of the charge separation caused by the presence of this p-n junction, the extra carriers (electrons and holes) generated by the photons can then be used to drive an external load to complete the circuit.

In a conventional IBC cell 100 manufacturing process, each of the p+ emitter 112 and the n+ BSF 114, which have complex geometries and which are alternately disposed, may be generated using the ion implantation process. To achieve their geometries, two patterned or selective ion implantation process are performed. In the first patterned ion implantation process, a first mask (not shown) is disposed on the base 102, which is initially doped with n-type dopants. The first mask contains an aperture that corresponds to the geometry of the p+ emitter 112. After the mask is disposed, the base 102 is implanted with p-type dopants, resulting in p+ emitter 112, and the pattern of the mask is transferred onto the base 102. Thereafter, a second mask (not shown) having an aperture corresponding to the geometry of the n+ BSF 114 is disposed. The base 102 is then implanted with n-type dopants, and the second patterned or selective ion implantation is performed.

The process noted above requires many steps, each of which may be expensive. Any reduction in the number of the steps included in the manufacturing of the IBC solar cells would have a positive impact on lowering the cost of the solar cells and the implementation of solar cells. This will enable the wider availability of this clean energy technology. As such, new techniques are needed.

SUMMARY

Techniques for manufacturing a device are disclosed. In accordance with one exemplary embodiment, the technique may be realized as a method for forming a solar cell. The method may comprise: implanting p-type dopants into a substrate via a blanket ion implantation process; implanting n-type dopants into the substrate via the blanket ion implantation process; and performing a first annealing process to form the p-type region and performing a second annealing process to form a second n-type region.

In accordance with other aspects of this particular exemplary embodiment, the n-type region may be interposed between the p-type region and a surface of the substrate.

In accordance with further aspects of this particular exemplary embodiment, the first annealing process is a selective annealing process and wherein the second annealing process is a blanket annealing process.

In accordance with additional aspects of this particular exemplary embodiment, the first and second annealing processes may be selective annealing processes.

In accordance with further aspects of this particular exemplary embodiment, the first annealing process may be performed after implanting p-type dopants and before implanting n-type dopants.

In accordance with other aspects of this particular exemplary embodiment, the method may further comprise: forming a dielectric layer on the surface of the substrate after the first annealing process and before the implanting n-type dopants.

In accordance with further aspects of this particular exemplary embodiment, the method may further comprise: extracting a portion of the p-type dopants implanted into the substrate into the dielectric.

In accordance with additional aspects of this particular exemplary embodiment, the dielectric may be $SiO_2$.

In accordance with other aspects of this particular exemplary embodiment, the method may further comprise: forming a dielectric layer on the surface of the substrate after the first and second annealing processes; forming a first contact hole extending from the dielectric layer to the p-type region; and forming a second contract hole extending from the dielectric layer to the n-type region.

In accordance with another exemplary embodiment, the technique may be realized as a method for forming a solar cell. The method may comprise: implanting p-type dopants into an n-type substrate via a blanket ion implantation process; implanting n-type dopants into the n-type substrate;

performing a first annealing process to form a first conductivity region, the first annealing process being a selectively annealing process; and performing a second annealing process to form a second conductivity region, In accordance with other aspects of this particular exemplary embodiment, the second annealing processes may be a blanket annealing process.

In accordance with further aspects of this particular exemplary embodiment, the second annealing process may be the selective annealing process.

In accordance with additional aspects of this particular exemplary embodiment, the implanting n-type dopants into the substrate may be performed prior to the implanting the p-type dopants.

In accordance with other aspects of this particular exemplary embodiment, the implanting n-type dopants into the substrate may be performed after the implanting the p-type dopants.

In accordance with further aspects of this particular exemplary embodiment, the implanting the n-type dopants into the substrate may be achieved via the selective ion implantation process.

In accordance with additional aspects of this particular exemplary embodiment, the second conductivity region is interposed between the first conductivity region and a surface of the substrate.

In accordance with other aspects of this particular exemplary embodiment, the method may further comprise: forming a dielectric layer on the substrate; and extracting a portion of the p-type dopants from the substrate into the dielectric layer, where the dielectric layer may be formed after the first annealing process but before the second annealing process, and where the dielectric layer may be in contact with the first conductivity region.

In accordance with further aspects of this particular exemplary embodiment, the dielectric layer may be $SiO_2$.

In accordance with another exemplary embodiment, the technique may be realized as a method for forming a solar cell. The method may comprise: implanting p-type dopants into a substrate via a blanket ion implantation process; implanting n-type dopants into the substrate via the blanket ion implantation process; and performing a first annealing process to form the p-type region and performing a second annealing process to form a second n-type region, where at least one of the first and second annealing process is a selective annealing process.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 2A-2H illustrate an exemplary method for manufacturing an IBC solar cell according to one embodiment of the present disclosure.

FIG. 5A-5H illustrate another exemplary method for manufacturing an IBS solar cell according to another embodiment of the present disclosure.

Figure 1:
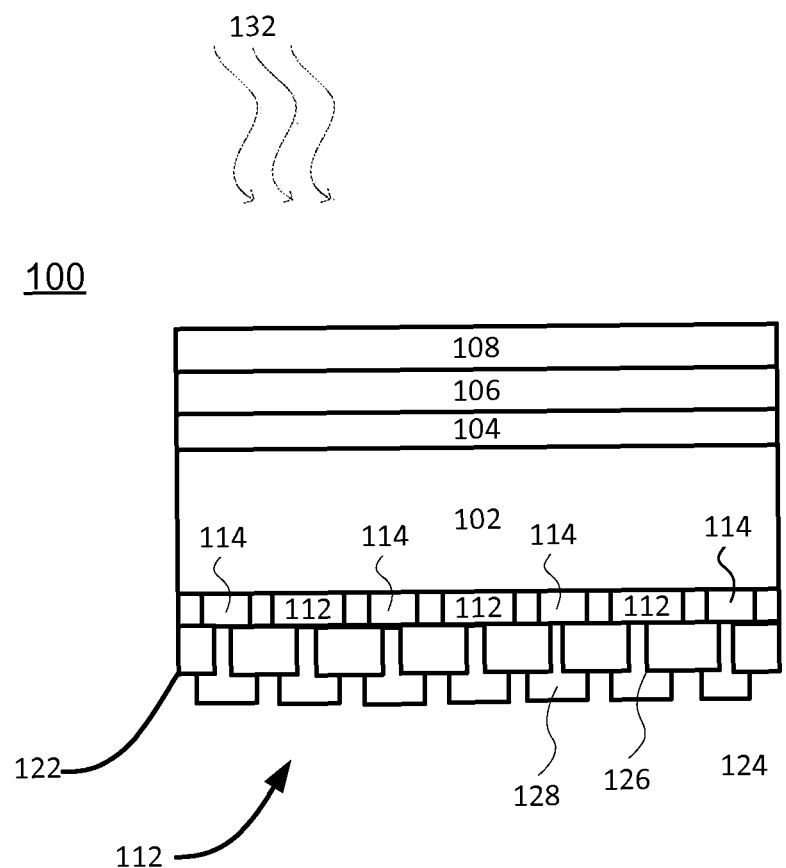
FIG. 1 illustrates a side view of a conventional IBC solar cell 100.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

DETAILED DESCRIPTION

Herein, a technique for manufacturing devices is disclosed. For clarity and simplicity, the technique disclosed in the present disclosure will focus on technique for manufacturing a solar cell device. The technique, however, may be just as applicable for forming other types of device, including integrated circuit (IC) devices, and those of ordinary skill in the art will recognize that the present disclosure may also encompass techniques for manufacturing other devices.

For clarity and simplicity, the technique will focus on processing one side of the substrate in manufacturing the device. For example, the present disclosure will focus on processing the backside of the IBC solar cell. Although the disclosure is limited to a description of processing only one side of the substrate, those of ordinary skill in the art will recognize that the present disclosure is not limited to devices that are processed only on one side.

One of the processes included in the techniques is a process for introducing impurities into the substrate or a portion therein. With this process, a region having a particular conductivity may be formed. If impurities with different conductivities are introduced, regions with different conductivities may be formed. For example, p-type dopants or impurities that act as acceptors may be introduced into a region of a substrate to form p-type region having p-type conductivity. Meanwhile, n-type dopants or impurities that act as acceptors may be introduced into another region of a substrate to form an n-type region having n-type conductivity.

Although various processes may be used to introduce the impurities, the technique disclosed herein will focus on ion implantation process. In this approach, the impurities may be introduced as charged atomic or molecular ions. Although not described in detail, other processes including thermal diffusion process, gas immersion laser doping (GILD) process, and other doping or impurities introducing processes may be just as applicable and are not precluded in the present disclosure. In addition, the impurities may be introduced in the form of neutrals or uncharged atoms or molecules.

Referring to FIG. 2A-2H there is shown an exemplary technique for manufacturing a device according to one embodiment of the present disclosure. First, a substrate 202 may be prepared for processing (FIG. 2A). In the present embodiment, the substrate 202 may be a silicon (Si) substrate pre-doped with n-type dopants. Although an n-type Si substrate 202 is preferred, the present disclosure does not preclude a p-type substrate or an intrinsic substrate, not pre-doped. Moreover, the present disclosure is not limited to a Si substrate.

Into the substrate 202, p-type dopants 203 may be ion implanted during a first ion implantation process. In the process, a first implant region 204 may be formed (FIG. 2B).

Examples of p-type dopants 203 may include species found in Group 3 of the periodic table such as boron (B), aluminum (Al), gallium (Ga), indium (In), and thallium (Tl). The implantation process performed to implant the p-type dopants 203 may be a blanket or unpatterned ion implantation process. In the blanket or unpatterned process, the substrate is processed without selectively targeting a specific area in the substrate. Accordingly, property of the substrate along a lateral direction is not intentionally varied. Such a process may differ from a selective process, which selectively and intentionally targets a specific area of the substrate for processing or for additional processing. In a selective ion implantation process, for example, the targeted area may be implanted, whereas the non-targeted area is not implanted. Or, the targeted area may be ion implanted at a greater ion dose and/or implant energy compared to the non-targeted area. Accordingly, one or more properties of the targeted and non-targeted areas along the lateral direction of the substrate may intentionally vary in the selective process.

The implantation of the p-type dopants 203 may be followed by a first annealing process. In the present embodiment, the first annealing process may be a selective annealing process. In this process, the annealing energy 205 (e.g. thermal, optical, etc . . . ) is introduced to the targeted area. Meanwhile, the annealing energy 205 is not introduced to the non-targeted area positioned laterally from the targeted area (FIG. 2C). In the present disclosure, the targeted and non-targeted regions may be located at various positions in the substrate 202. However, FIG. 2C illustrates, for clarity and simplicity, the targeted area may be located near a side of the substrate, whereas the non-targeted area may be positioned near the center.

When exposed to the annealing energy 205, the p-type dopants 203 in the targeted area may thermally diffuse deeper into the substrate 202. At the same time, the p-type dopants 203 may be activated to form the first conductivity region 204$i$. The non-targeted area, positioned laterally from the targeted area or the first conductivity area 204$i$ and not be exposed to the annealing energy 205, may remain as a non-annealed region 204$ii$.

After selectively annealing the substrate 202 to form the first conductivity region 204$i$, a second ion implantation process may be performed (FIG. 2D). In this second ion implantation process, n-type dopants 207 may be implanted to form a second implant region 206 (FIG. 2D). Specific examples of the second dopants in the Si substrate 202 may include species in Group 5 of the periodic table such as phosphorous (P), arsenic (As), antimony (Sb), and bismuth (Bi). Much like the first ion implantation process, the second ion implantation process may be the blanket or unpatterned implantation process. Compared to the p-type dopants 203, the n-type dopants 207 may be implanted at a greater dose. In addition, the ion implant energy may be controlled such that the depth of the second implant region 206 formed may be less than the depth of the first conductivity region 204$i$.

The formation of the second implant region 206 may be followed by a second annealing process. Unlike the first annealing process, the second annealing process may be a blanket annealing process (FIG. 2E). During this blanket annealing process, the n-type dopants 207 may thermally diffuse deeper into the substrate 202. At the same time, n-type dopants 207 may be activated to form the second conductivity region 206$i$. In the present embodiment, the second conductivity region 206$i$ may preferably be positioned between the first conductivity region 204$i$ and the substrate's surface. With the second conductivity region 206$i$ formed above, a patterned floating junction may form. In the present disclosure the floating junction may be the first conductivity region 204$i$ that is formed under the second conductivity region 206$i$.

A dielectric passivation layer 210 may then be deposited on the second conductivity region 206$i$ (FIG. 2F). Examples of the dielectric passivation layer 210 may include alumina ($Al_2O_3$) and silicon dioxide ($SiO_2$). The dielectric passivation layer 210 is then patterned to form n-metal and p-metal contact holes 212$a$ and 212$b$. The n-metal contact hole 212$a$ may extend from the passivation layer 210 to the second conductivity region 206$i$ that was not annealed during the first annealing process. Meanwhile, the p-metal contact hole 212$a$ may extend from the passivation layer 210 to the first conductivity region 204$i$. In the present embodiment, various processes including laser ablation, sputtering, and other etching processes may be used to form the n-metal and p-metal contact holes 212$a$ and 212$b$.

After the n-metal and p-metal contact holes 212$a$ and 212$b$ are formed, n-metal contact 214 and p-metal contact 216 may be formed. If the other side of the substrate 202 has not been processed, the technique may proceed with processing the other side of the substrate 202.

Referring to FIG. 3A-3J, there is shown another exemplary method for manufacturing a device according to another embodiment of the present disclosure. Those of ordinary skill in the art will recognize that some features disclosed hereinafter may be similar to the features disclosed in the earlier embodiment shown in FIG. 2A-2H. Such similar features may have the same reference numbers, and a detailed description of such similar features may be omitted for clarity and simplicity. As such, the description of such features should be understood in relation to the similar features shown in FIG. 2A-2H.

Figure 3A:
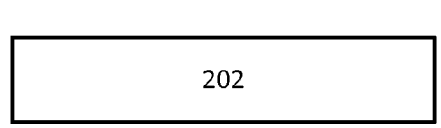
FIG. 3A-3J illustrate another exemplary method for manufacturing an IBS solar cell according to another embodiment of the present disclosure.
Figure 3B:
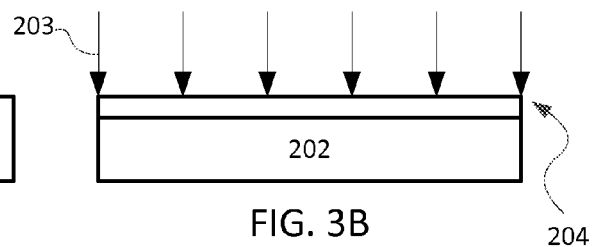
Figure 3C:
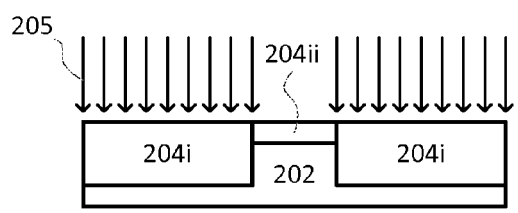

The technique of the present embodiment may begin with the preparation of an n-type Si substrate 202 (FIG. 3A) for processing. Thereafter, the first ion implantation process may be performed. In the first ion implantation process, the substrate 202 may be implanted with the p-type dopants 203 via the blanket ion implantation process to form the first implant region 204 (FIG. 3B). The first implantation process may be followed by the first annealing process (FIG. 3C). Much like the prior embodiment shown in FIG. 2A-2H, the first annealing process may be the selective annealing process, where the targeted area is exposed to the annealing energy 205. The first annealing process may result in formation of the first conductivity region 204$i$. Meanwhile, the non-targeted area, positioned laterally from the targeted area or the first conductivity area 204$i$, may remain as a non-annealed region 204$ii$.

Figure 3D:
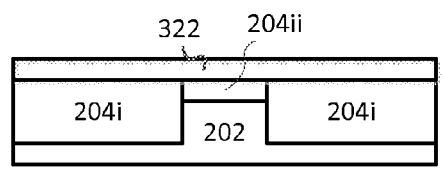
Figure 3E:
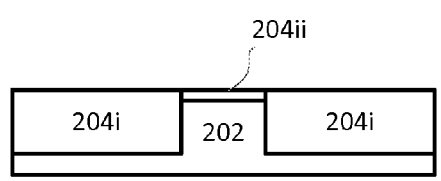

After the first annealing process, a thermal oxide layer 322 may be grown, preferably over the non-annealed region 204$ii$, and optionally over the first conductivity region 204$i$ (FIG. 3D). In the present disclosure, the thermal oxide 322 may be silicon dioxide ($SiO_2$). Thereafter, the thermal oxide layer 322 may be removed from the substrate 202 (FIG. 3E). In the present disclosure, the p-type dopants 203 near the thermal oxide layer 322 may diffuse into the thermal oxide layer 322. Such p-type dopants 203 may be removed from the substrate 202 along with the thermal oxide layer 322. The amount of the p-type dopants 203 removed from the non-annealed region 204$ii$ may be greater than the p-type dopants 203 in the first conductivity region 204$i$. Unlike those in the non-annealed region 204$ii$, the p-type dopants 203 in the first conductivity region 204$i$ had diffused deeper into the substrate 202 during the first, selective annealing process, and much less p-type dopants in the first conductivity region 204$i$ are available form removal. The removal of the p-type dopants 203 from the non-annealed region 204$ii$ may enhance the contrast in the dose of the p-type dopants 203 between first conductivity region 204*i* and the non-annealed region 204*ii*.

Figure 3F:
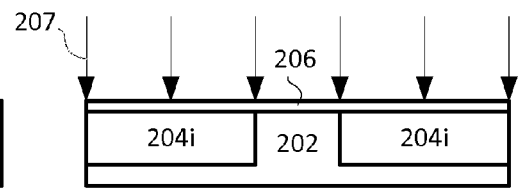

After removing the thermal oxide layer 322, the second ion implantation process may be performed. In the present embodiment, the second ion implantation may be performed to implant n-type dopants 207 to form the second implant region 206 (FIG. 3F). Much like the previous embodiment shown in FIG. 2A-2H, the second ion implantation process may be the blanket ion implantation process. But, the dose of the n-type dopants 207 may be less. As more p-type dopants 203 are removed from the substrate 202 along with the thermal oxide layer 322, less n-type dopants 207 may be necessary to counterdope the non-annealed region 204*ii* and generate n-type implant region 206. The implant energy, meanwhile, may be chosen such that implant depth of the second implant region 206 does not extend vertically as much the first conductivity region 204*i*.

Figure 3G:
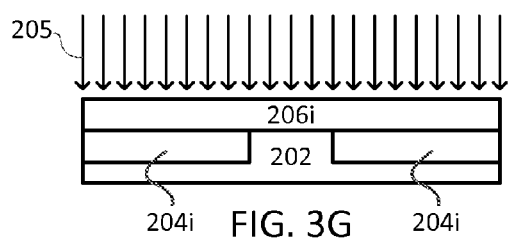

After the second ion implantation process, a second annealing process may be performed. The second annealing process may be the blanket annealing process (FIG. 3G). This blanket annealing process may result in the second conductivity region 206*i* between the first conductivity region 204*i* and the surface of the substrate. With the second conductivity region 206*i* formed above, a patterned floating junction may form. In the present disclosure the floating junction may be the first conductivity region 204*i* that is formed under the second conductivity region 206*i*.

Figure 3H:
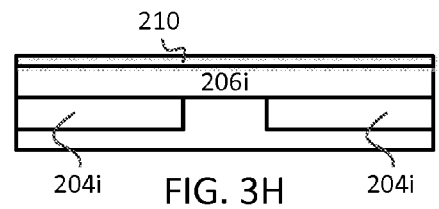
Figure 3I:
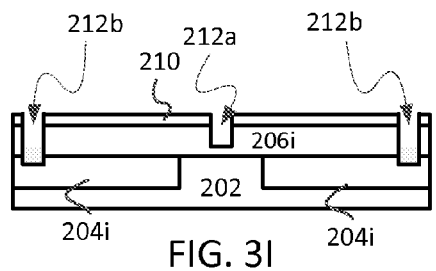
Figure 3J:
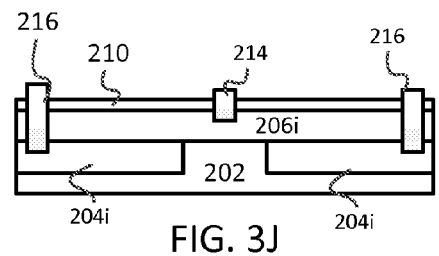

The dielectric passivation layer 210 may then be deposited on the second conductivity region 206*i* (FIG. 3H). The dielectric passivation layer 210 is then patterned to form n-metal and p-metal contact holes 212*a* and 212*b* (FIG. 3I), and the n-metal contact 214 and p-metal contact 216 may be formed (FIG. 3J). If the other side of the substrate 202 has not been processed at this time, the technique may proceed with processing the other side of the substrate 202.

Referring to FIG. 4A-4H, there is shown another exemplary method for manufacturing a device according to another embodiment of the present disclosure. Those of ordinary skill in the art will recognize that some features disclosed hereinafter may be similar to the features disclosed in the earlier embodiments shown in FIGS. 2A-2H and 3A-3J. Such similar features may have the same reference numbers, and a detailed description of such similar features may be omitted for clarity and simplicity. As such, the description of such features should be understood in relation to the similar features shown in FIGS. 2A-2H and 3A-3J.

Figure 4A:
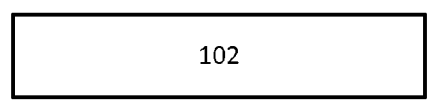
FIG. 4A-4H illustrate another exemplary method for manufacturing an IBS solar cell according to another embodiment of the present disclosure.
Figure 4B:
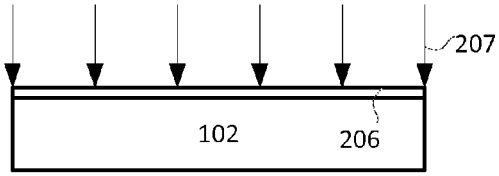

The technique begins with the preparation of an n-type Si substrate 202 for processing (FIG. 4A). Thereafter, a first ion implantation process may be performed (FIG. 4B). Unlike the earlier embodiment, the n-type dopants 207 are ion implanted into the substrate 202 during the first ion implantation process. However, the first ion implantation in the present embodiment, much like the earlier embodiments, may be the blanket ion implantation process. The first blanket ion implantation process may result in formation of the second implant region 206 containing the n-type dopants 207.

Figure 4C:
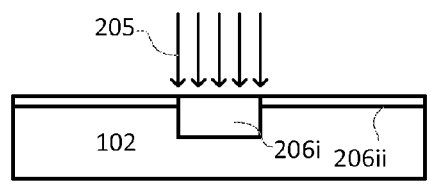

The implantation of the n-type dopants 207 may be followed by the first annealing process (FIG. 4C). Similar to the first annealing process in the earlier embodiment, the first annealing process may be the selective annealing process, where the annealing is performed on the targeted area, but not on the non-targeted area. Although the targeted area of the first annealing process may be positioned in various locations, the targeted area in the present embodiment, is illustrated to be located near the center of the substrate (FIG. 4C). The first annealing process may result in formation of the second conductivity region 206*i*. Meanwhile, the non-targeted area, positioned laterally from the targeted area may remain as the non-annealed region 206*ii*. The depth of the second conductivity region 206*i* containing activated n-type dopants 207 may be greater than the depth of the non-annealed region 206*ii*.

Figure 4D:
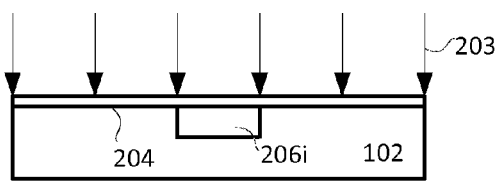

After forming the second conductivity region 206*i*, the second ion implantation process may be performed to form the first implanted region 204 (FIG. 4D). Unlike the prior embodiments, p-type dopants 203 may be ion implanted during the second ion implantation process. However, the blanket ion implantation process may be performed to implant the p-type dopants 203. The implant energy of the p-type dopants 203 may be comparable to the implant energy of the n-type dopants 207, and the depth of the first implant region 204 may be comparable to the depth of the second implant region 206. However, the dose of the p-type dopants 203 implanted during the second ion implantation process may be greater than the dose of the n-type dopants 207 implanted during the first ion implantation process.

Figure 4E:
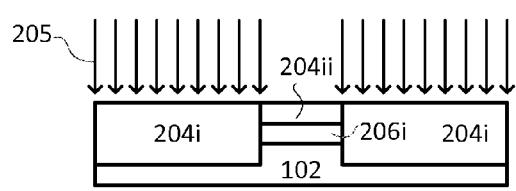

Thereafter, the second annealing process may be performed (FIG. 4E). In the present embodiment, the second annealing process may also be the selective annealing process. Moreover, the selective annealing process may be performed on the area that was not annealed during the first annealing process. After the second selective annealing process, the first conductivity region 204*i* containing the activated p-type dopants 203 may form. In the present embodiment, the n-type dopants 207 may remain in the first conductivity region 204*i*, and also be activated during the second annealing process. However, the first conductivity region 204*i* may remain the p-type, as the dose of the p-type dopants 203 implanted during the second ion implantation process may be greater. After the second annealing process, the first and second conductivity regions 204*i* and 206*i* may form, and such regions may be positioned laterally with respect to one another.

Figure 4F:
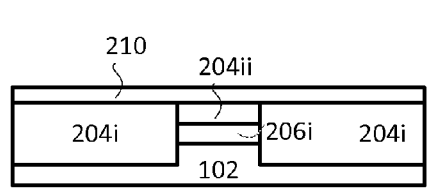
Figure 4G:
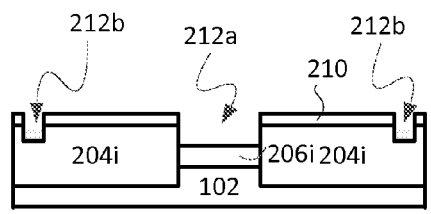
Figure 4H:
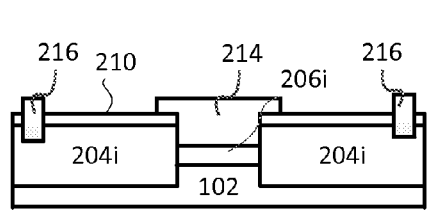

The dielectric passivation layer 210 may then be deposited on the first and second conductivity region 204*i* and 206*i* (FIG. 4F). The dielectric passivation layer 210 is then patterned to form n-metal and p-metal contact holes 212*a* and 212*b*, as shown in FIG. 4G, and the n-metal contact 214 and p-metal contact 216 may be formed (FIG. 4H). If the other side of the substrate 202 has not been processed at this time, the technique may proceed with processing the other side of the substrate 202.

Referring to FIG. 5A-5H, there is shown another exemplary method for manufacturing a device according to another embodiment of the present disclosure. Those of ordinary skill in the art will recognize that some features disclosed hereinafter may be similar to the features disclosed in the earlier embodiments shown in FIGS. 2A-2H, 3A-3J, and 4A-4H. Such similar features may have the same reference numbers, and a detailed description of such similar features may be omitted for clarity and simplicity. As such, the description of such features should be understood in relation to the similar features shown in FIGS. 2A-2H, 3A-3J, and 4A-4H.

The technique begins with the preparation of an n-type Si substrate 202 for processing (FIG. 5A). Thereafter, a first ion implantation process may be performed (FIG. 5B). In the present embodiment, the substrate 202 is implanted with the p-type dopants 203 to form the first implant region 204. Similar to the earlier embodiments, the first ion implantation process may be the blanket ion implantation process.

The implantation of p-type dopants 203 may be followed by the first annealing process (FIG. 5C). In the present embodiment, the first annealing process may be the selective annealing process, where the annealing process occurs on the targeted area, but not on the non-targeted area. Although the targeted area of the first annealing process may be positioned in various locations, the targeted area in the present embodiment, is illustrated to be located near a side of the substrate 202 (FIG. 5C). The first annealing process may result in formation of the first conductivity region 204i. Meanwhile, the non-targeted area, positioned laterally from the targeted second conductivity region 206i, may remain as a non-annealed region 204ii. The depth of the first conductivity region 204i containing the activated p-type dopants 203 may be greater than the depth of the non-annealed region 204ii.

After the first selective annealing process, the dielectric passivation layer 210 may form on the first conductivity region 204i and the non-annealed region 204ii (FIG. 5D). An aperture 412 exposing at least a portion of the non-annealed region 204ii may be generated on the dielectric passivation layer 210 using various etching methods (FIG. 5E).

Thereafter, the second ion implantation process may be performed to implant the n-type dopants 207 into the substrate 202 (FIG. 5F). Unlike the earlier embodiments shown in FIGS. 2A-2H, 3A-3J, and 4A-4H, the second ion implantation process performed in the present embodiment may be a selective ion implantation process. Although the ion implantation process may be performed on the entire substrate 202, only a targeted area of the substrate 202 aligned with the aperture 412 is exposed to n-type dopant 207 ions (FIG. 5F). The targeted area, in the present embodiment, may be the area that was not annealed during the first annealing process. In the process, second implant region 206 containing the n-type dopants 207 may form.

The second ion implantation process may be followed by the second annealing process. In the present embodiment, the second annealing process may be a selective annealing process, annealing only a targeted second implant region 206. Areas laterally adjacent from the targeted second implant region 206 may be blocked by the dielectric passivation layer 210 and not exposed to the second annealing process. The second annealing process may result in formation of the second conductivity region 206i.

After the second conductivity region 206i is formed, the dielectric passivation layer 210 is further patterned to form the p-metal contact holes 212b (FIG. 5G). Thereafter, and the n-metal contact 514 and p-metal contact 216 may be formed (FIG. 5H). If the other side of the substrate 202 has not been processed at this time, the technique may proceed with processing the other side of the substrate 202.

Herein, techniques for manufacturing devices are disclosed. The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of forming a solar cell, the method comprising:
    implanting p-type dopants into a substrate through a surface of the substrate via a first blanket ion implantation process;
    implanting n-type dopants into the substrate via a second blanket ion implantation process; and
    performing a first annealing process to form a p-type region and performing a second annealing process to form an n-type region, the p-type region and the n-type region being proximate to each other, wherein
    all regions of the surface of the substrate implanted by the first blanket ion implantation process are also implanted by the second blanket ion implantation process.

2. The method according to claim 1, wherein the n-type region is interposed between the p-type region and the surface of the substrate.

3. The method according to claim 1, wherein the first annealing process is a selective annealing process and wherein the second annealing process is a blanket annealing process.

4. The method according to claim 1, wherein the first and second annealing processes are selective annealing processes.

5. The method according to claim 3, wherein the first annealing process is performed after the implanting p-type dopants and before the implanting n-type dopants.

6. The method according to claim 5, further comprising:
    forming a dielectric layer on the surface of the substrate after the first annealing process and before the implanting n-type dopants.

7. The method according to claim 6, further comprising:
    extracting a portion of the p-type dopants implanted into the substrate into the dielectric layer.

8. The method according to claim 7, wherein the dielectric layer is $SiO_2$.

9. The method according to claim 1, further comprising:
    forming a dielectric layer on the surfaces of the substrate after the first and second annealing processes;
    forming a first contact hole extending from the dielectric layer to the p-type region; and
    forming a second contract hole extending from the dielectric layer to the n-type region.

10. A method of forming a solar cell, the method comprising:
    implanting p-type dopants into an n-type substrate via a blanket ion implantation process;
    implanting n-type dopants into the n-type substrate; and
    performing a first annealing process to form a first conductivity region, the first annealing process being a selectively annealing process; and
    performing a second annealing process to form a second conductivity region, wherein one of the implanting p-type dopants and implanting n-type dopants is performed after the first annealing process, and implants dopants into at least a region of the substrate not annealed by the first annealing process.

11. The method according to claim 10, wherein the second annealing processes is a blanket annealing process.

12. The method according to claim 10, wherein the second annealing process is a selective annealing process.

13. The method according to claim 12, wherein the implanting n-type dopants into the substrate is performed prior to the implanting the p-type dopants.

14. The method according to claim 11, wherein the implanting n-type dopants into the substrate is performed after the implanting p-type dopants.

15. The method according to claim 14, wherein the implanting the n-type dopants into the substrate is achieved via a selective ion implantation process.

16. The method according to claim 10, wherein the second conductivity region is interposed between the first conductivity region and a surface of the substrate.

17. The method according to claim 10, further comprising:
    forming a dielectric layer on the substrate; and
    extracting a portion of the p-type dopants from the substrate into the dielectric layer, wherein the dielectric layer is formed after the first annealing process but before the second annealing process, and wherein the dielectric layer is in contact with the first conductivity region.

18. The method according to claim 17, wherein the dielectric layer is $SiO_2$.

19. A method of forming a solar cell, the method comprising:
  implanting p-type dopants into a surface via a first blanket ion implantation process;
  implanting n-type dopants into the substrate via a second blanket ion implantation process; and
  performing a first annealing process to form a p-type region and performing a second annealing process to form an n-type region, wherein at least one of the first and second annealing process is a selective annealing process, and wherein all surfaces of the substrate implanted by the first blanket ion implantation process are also implanted by the second blanket ion implantation process.

* * * * *